United States Patent
Her et al.

(10) Patent No.: US 11,024,383 B2
(45) Date of Patent: Jun. 1, 2021

(54) MEMORY DEVICE, MEMORY CONTROLLER, AND STORAGE DEVICE INCLUDING MEMORY DEVICE AND MEMORY CONTROLLER

(71) Applicant: SK hynix Inc., Icheon-si (KR)

(72) Inventors: Min Ho Her, Cheongju-si (KR); Dong Hyun Kim, Icheon-si (KR); Seung Il Kim, Cheongju-si (KR); Youn Ho Jung, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/678,028

(22) Filed: Nov. 8, 2019

(65) Prior Publication Data

US 2020/0381051 A1 Dec. 3, 2020

(30) Foreign Application Priority Data

May 29, 2019 (KR) ........................ 10-2019-0063447

(51) Int. Cl.
| | |
|---|---|
| *G11C 16/04* | (2006.01) |
| *G11C 16/08* | (2006.01) |
| *G11C 16/14* | (2006.01) |
| *G11C 16/10* | (2006.01) |
| *G06F 3/06* | (2006.01) |

(52) U.S. Cl.
CPC ............ *G11C 16/08* (2013.01); *G06F 3/0604* (2013.01); *G06F 3/0652* (2013.01); *G06F 3/0659* (2013.01); *G06F 3/0679* (2013.01); *G11C 16/10* (2013.01); *G11C 16/14* (2013.01); *G11C 16/0483* (2013.01)

(58) Field of Classification Search
CPC ......... G11C 16/08; G11C 16/10; G11C 16/14; G11C 16/0483; G06F 3/0604; G06F 3/0652; G06F 3/0659; G06F 3/0679
See application file for complete search history.

(56) References Cited

U.S. PATENT DOCUMENTS

| | | | | |
|---|---|---|---|---|
| 7,379,367 | B2 * | 5/2008 | Kim ...................... | G11C 11/406 365/222 |
| 9,772,803 | B2 * | 9/2017 | Jung ...................... | G06F 3/0616 |
| 10,157,123 | B1 * | 12/2018 | Vaduvatha ............ | G06F 3/0659 |
| 2016/0062688 | A1 * | 3/2016 | Kwon .................. | G06F 12/0246 711/103 |

FOREIGN PATENT DOCUMENTS

| | | |
|---|---|---|
| KR | 1020160047661 A | 5/2016 |
| KR | 1020180077885 A | 7/2018 |

* cited by examiner

*Primary Examiner* — Pho M Luu

(74) *Attorney, Agent, or Firm* — William Park & Associates Ltd.

(57) ABSTRACT

The memory controller controls a memory device. The controller is configured to determine to perform a target operation on a first memory block and determine an activation voltage level transferred to a block word line based on block state information of a second memory block.

16 Claims, 14 Drawing Sheets

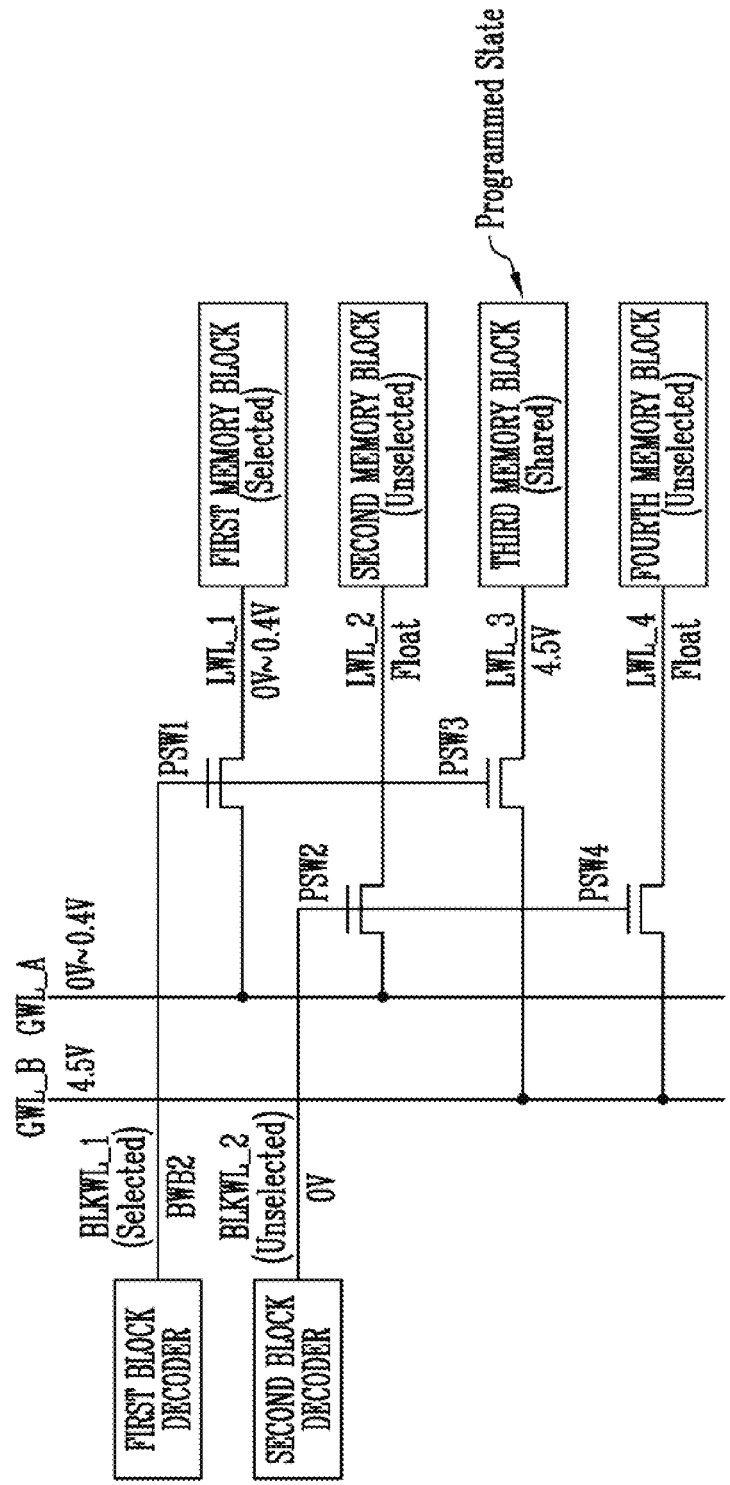

FIG. 11A

| BLOCK NUMBER | STATE |
|---|---|
| BLK1 | P |
| BLK2 | E |
| BLK3 | E |
| BLK4 | P |
| ... | ... |
| BLKz | E |

FIG. 11B

| BLOCK NUMBER | STATE |
|---|---|
| BLK1 | P |
| BLK2 | E |
| BLK3 | P |
| BLK4 | P |
| ... | ... |
| BLKz | E |

MEMORY DEVICE, MEMORY CONTROLLER, AND STORAGE DEVICE INCLUDING MEMORY DEVICE AND MEMORY CONTROLLER

CROSS-REFERENCE TO RELATED APPLICATION

The present application claims priority under 35 U.S.C. § 119(a) to Korean patent application number 10-2019-0063447, filed on May 29, 2019, the entire disclosure of which is incorporated herein by reference in its entirety.

BACKGROUND

1. Technical Field

The present disclosure relates to an electronic device, and more particularly, to a memory device, a memory controller, and a storage device including the memory device and the memory controller.

2. Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

The volatile memory device is a device that stores data only when power is supplied and loses the stored data when the power supply is cut off. The volatile memory device includes a static random access memory (SRAM), a dynamic random access memory (DRAM), and the like.

The non-volatile memory device is a device that does not lose data even when power is cut off. The non-volatile memory device include a read only memory (ROM), a programmable ROM (PROM), an electrically programmable ROM (EPROM), an electrically erasable and programmable ROM (EEPROM), a flash memory, and the like.

SUMMARY

A memory controller according to an embodiment of the present disclosure may control a memory device. The memory device may include a first memory block connected to a first global word line through a first path switch, a second memory block connected to a second global word line through a second path switch, and a block decoder connected to a gate of the first and second path switches through a block word line. The memory controller may include a block state storage configured to store block state information of the first and second memory blocks, and a command controller configured to determine to perform a target operation on the first memory block and determine an activation voltage level transferred to the block word line based on the block state information of the second memory block.

A storage device according to another embodiment of the present disclosure may include a memory device and a memory controller. The memory device may include a block decoder, a selected memory block, and a shared memory block. The memory controller may be configured to control an operation of the memory device. The selected memory block may be connected to a first global word line through a first path switch, the shared memory block is connected to a second global word line through a second path switch, and the block decoder is connected to gates of the first and second path switches through a block word line. The memory controller may control the memory device to set an activation voltage level transferred to the block word line based on a state of the shared memory block.

A memory device may be controlled by a method of operating a memory controller according to still another embodiment of the present disclosure. The memory device may include a first memory block connected to a first global word line through a first path switch, a second memory block connected to a second global word line through a second path switch, and a block decoder connected to a gate of the first and second path switches through a block word line. The method of operating the memory controller includes determining to control the memory device to perform a target operation for the first memory block, adjusting an activation voltage level of the block word line based on a state of the second memory block, and controlling the memory device to perform the target operation for the first memory block.

BRIEF DESCRIPTION OF THE DRAWINGS

FIGS. 10A and 10B are diagrams for describing an erase operation according to a state of the shared memory block.

FIGS. 11A and 11B are diagrams for describing state information table stored in a block state storage 210.

DETAILED DESCRIPTION

Figure 1:
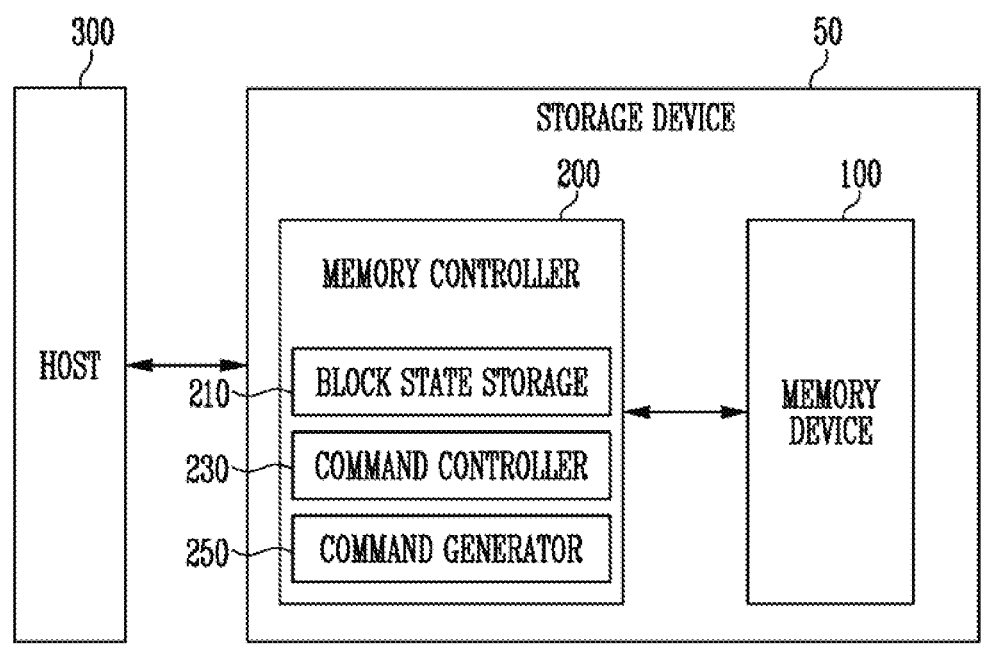
FIG. 1 is a diagram for describing a storage device according to an embodiment of the present disclosure.

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

Since various modifications and changes may be applied to the embodiment according to the concepts of the present disclosure and the embodiments according to the concepts of the present disclosure may have various forms, the specific embodiments will be illustrated in the drawings and described in the present specification or application. However, it should be understood that the embodiments according to the concepts of the present disclosure are not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope according to the concepts of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~ between," "immediately ~ between" or "adjacent to ~", "directly adjacent to ~", and the like should be construed similarly.

The terms used in the present specification are merely used to describe an embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, should not be construed as having idealistic or excessively formal meanings.

Hereinafter, the present disclosure will be described by describing embodiments of the present disclosure with reference to the accompanying drawings. Hereinafter, embodiments of the present disclosure will be described with reference to the accompanying drawings.

An embodiment of the present disclosure may provide a memory controller of which operation stability is improved.

Another embodiment of the present disclosure may provide a storage device of which operation stability is improved.

Still another embodiment of the present disclosure may provide a method of operating a memory controller of which operation stability is improved.

According to an embodiment of the present disclosure, a memory controller of which operation stability is improved may be provided.

According to another embodiment of the present disclosure, a storage device of which operation stability is improved may be provided.

According to still another embodiment of the present disclosure, a method of operating a memory controller of which operation stability is improved may be provided.

FIG. 1 is a diagram for describing a storage device according to an embodiment of the present disclosure.

Referring to FIG. 1, the storage device 50 may include a memory device 100 and a memory controller 200 controlling an operation of the memory device 100. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. That is, the memory device 100 may perform an operation that is the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

In an embodiment, a global line group may include a global drain select line, global word lines, and a global source select line. A local line group may include a drain select line, word lines, and a source select line. The local line group may correspond to one memory block. The global line group may be connected to the local line groups of at least two memory blocks.

The memory controller 200 may control overall operations of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host 300 and the memory device 100.

In an embodiment, the memory controller 200 may receive data and a logical block address (LBA) from the host 300 and convert the logical block address LBA into a physical block address (PBA) indicating an address of memory cells in which data included in the memory device 100 to be stored.

The memory controller 200 may control the memory device 100 to perform the program operation, the read operation or the erase operation in response to a request from the host 300. During the program operation, the memory controller 200 may provide a program command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the program command, the address, and the data to the memory device 100 regardless of the request from the host 300. For example, the memory controller 200 may provide a command, an address, and data to the memory device 100 so as to perform a background operation such as a program operation for wear leveling and a program operation for garbage collection.

In an embodiment, the memory controller 200 may control at least two memory devices 100. In this case, the memory controller 200 may control the memory devices 100 according to an interleaving method so as to improve operation performance. The interleaving method may be an operation method for overlapping operation periods of at least two memory devices 100.

The memory controller 200 may include a block state storage 210, a command controller 230, and a command generator 250. The block state storage 210 may store a state of the memory blocks included in the memory device 100. For example, the block state storage 210 may store data indicating whether each of memory blocks included in the memory device 100 is in an erased state or a programmed state. The command controller 230 may determine to perform a target operation for the memory block included in the memory device 100. In addition, the command controller 230 may determine an activation voltage level transferred to the block word line in the memory device based on block state information included in the block state storage 210. In addition, the command controller 230 may control an operation of the command generator 250. The command generator 250 may generate all commands for controlling the operation of the memory device 100 based on the control of the command controller 230. Operations of the memory controller 200 including the block state storage 210, the command controller 230, and the command generator 250 will be described later with reference to FIG. 7.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
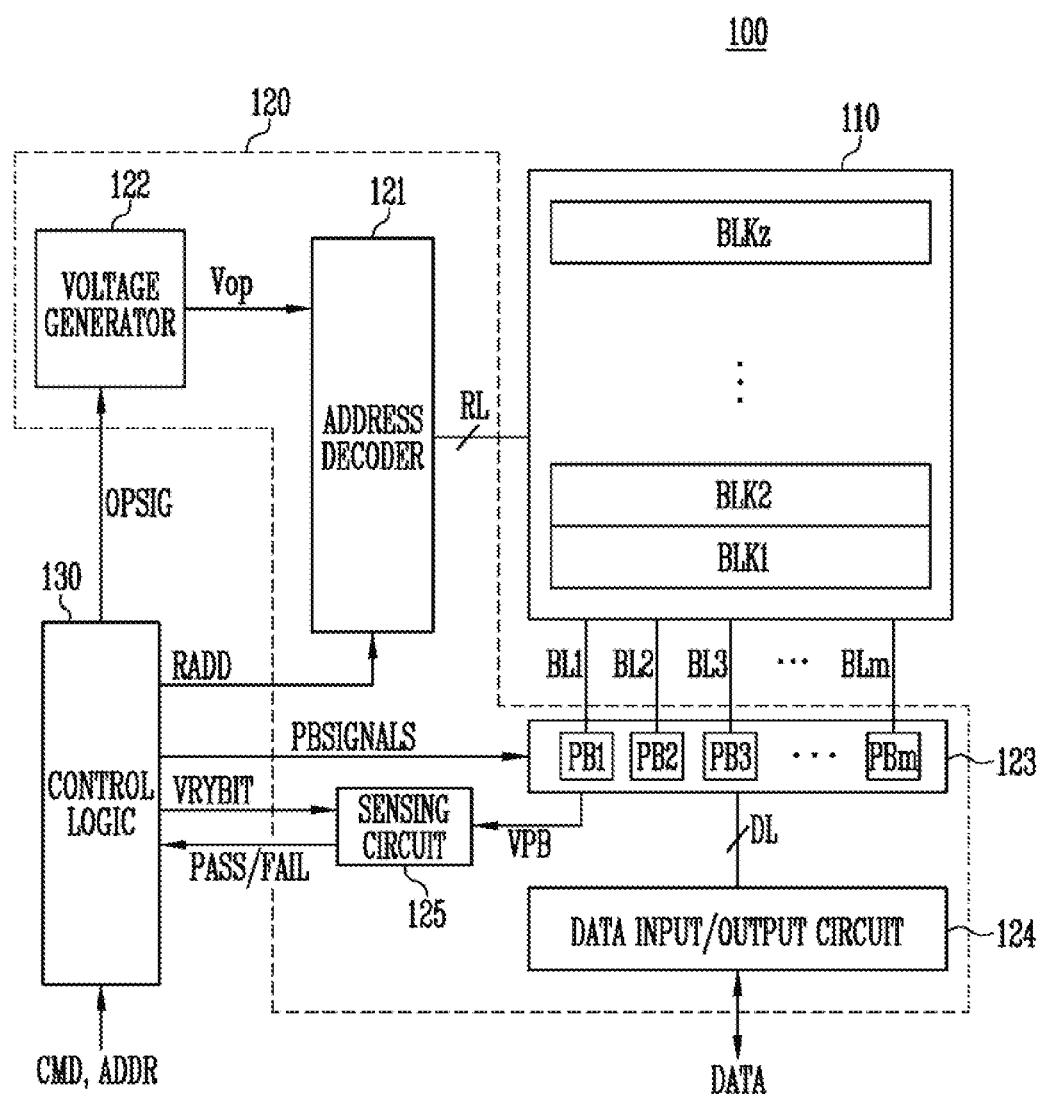
FIG. 2 is diagram for describing a structure of a memory device of FIG. 1.

FIG. 2 is diagram for describing a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include the address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

In an embodiment, the row lines RL may be local lines included in the local line groups. The local line group may correspond to one memory block. The local line group may include the drain select line, local word lines, and the source select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address RADD of the received address ADDR. The address decoder 121 may select at least one word line of a selected memory block by applying voltages supplied from the voltage generator 122 to at least one word line WL according to the decoded row address RADD.

During the program operation, the address decoder 121 applies a program voltage to a selected word line and applies a pass voltage having a level less than that of a program voltage to unselected word lines. During a program verify operation, the address decoder 121 applies a verify voltage to the selected word line and applies a verify pass voltage having a level greater than that of the verify voltage to the unselected word lines.

During the read operation, the address decoder 121 applies a read voltage to the selected word line and applies a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes the block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

In an embodiment, the address decoder 121 may include a block decoder and a path switch. The block decoder may be a row decoder. The block decoder may select at least one memory block among the plurality of memory blocks included in the memory cell array based on the decoded block address.

In an embodiment, the block decoder may generate a block selection signal for selecting at least two memory blocks connected to different global line groups among the plurality of memory blocks according to the decoded block address.

The block decoder may apply an activated block selection signal to the path switch connecting the local line group and the global local line group of the memory block to be selected. When the activated block selection signal is applied to the path switch, the local line group and the global line group of the selected memory block may be electrically connected to each other. Therefore, when an operation voltage Vop is applied to the global line group, the operation voltage Vop may be transferred to the local line group of the selected memory block through the path switch.

The block decoder may apply a deactivated block selection signal to the path switch connecting the local line group and the global local line group of the memory block that is not to be selected. When the deactivated block selection signal is applied to the path switch, the local line group and the global line group of the unselected memory block may be electrically disconnected from each other. Therefore, even when the operation voltage Vop is applied to the global line group, the operation voltage Vop might not be transferred to the local line group of the unselected memory block through the path switch.

The path switch may be controlled according to the block selection signal generated by the block decoder.

For example, the global line group and the local line group may be connected to each other through the path switch. For example, the global source select line may be connected to the source select lines included in at least two local line groups through the path switches. The global drain select line may be connected to the drain select lines included in at least two local line groups through the path switches. Each of the global word lines may be connected to the word lines of a corresponding position included in at least two local line groups through the path switches.

A signal controlling the path switches may be the block selection signal. When the activated block selection signal is applied to the path switch, the global line group and the local line group connected through the path switch may be electrically connected to each other. When the deactivated block selection signal is applied to the path switch, the global line group and the local line group connected through the path switch may be electrically disconnected from each other.

The operation voltage applied to the global line group may be transferred to the local line group of each of the memory blocks connected through the path switch. For example, a voltage applied to the global source select line may be transferred to the source select line of at least two local line groups connected through the path switch. A voltage applied to the global drain select line may be transferred to the drain select line of at least two local line groups connected through the path switch. A voltage applied to each of the global word lines may be transferred to a word line of a corresponding position of at least two local line groups connected through the path switch.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as the operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors to generate the plurality of operation voltages Vop.

The generated plurality of operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive data DATA to be stored through the data input/output circuit 124 and data lines DL.

During the program operation, when a program pulse is applied to the selected word line, the first to m-th page buffers PB1 to PBm may transmit the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal to the read and write circuit 123, and output the permission bit VRYBIT to the sensing circuit 125. In addition, the control logic 130 may determine whether or the verify operation is passed or failed in response to the pass or fail signal PASS/FAIL output by the sensing circuit 125.

Figure 3:
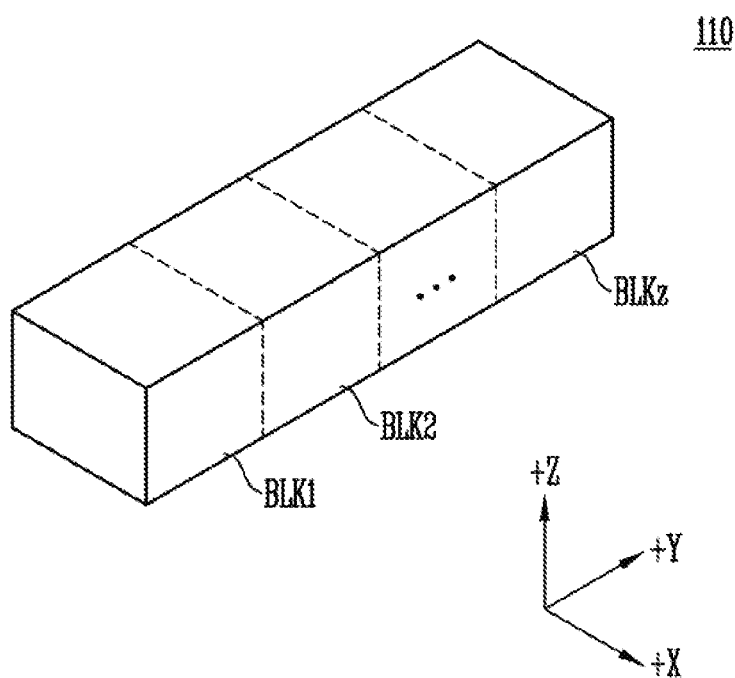
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a three-dimensional structure. Each memory block includes a plurality of memory cells stacked on a substrate. Such plurality of memory cells are arranged along a +X direction, a +Y direction, and a +Z direction. A structure of each memory block is described with reference to FIGS. 4 and 5.

Figure 4:
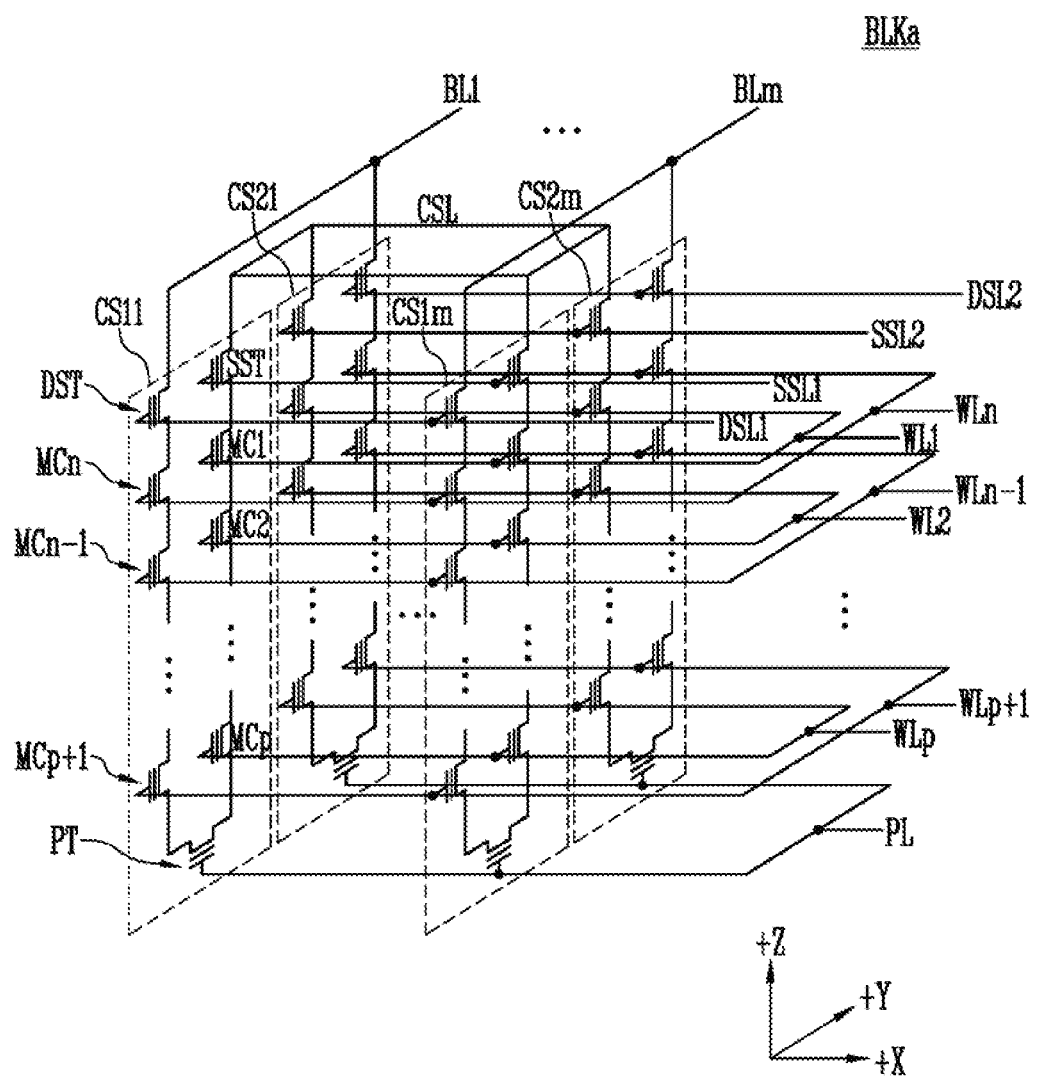
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 3.

Referring to FIG. 4, the memory block BLKa includes a plurality of cell strings CS11 to CS1*m* and CS21 to CS2*m*. As an example, each of the plurality of cell strings CS11 to CS1*m* and CS21 to CS2*m* may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and a drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an example, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1 of the cell strings CS11 to CS1m of the first row configure one page. The memory cells connected to the first word line WL1 of the cell strings CS21 to CS2m of the second row configure another page. The cell strings arranged in one row direction may be selected by selecting any one of the drain select lines DSL1 and DSL2. One of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to the odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 5:
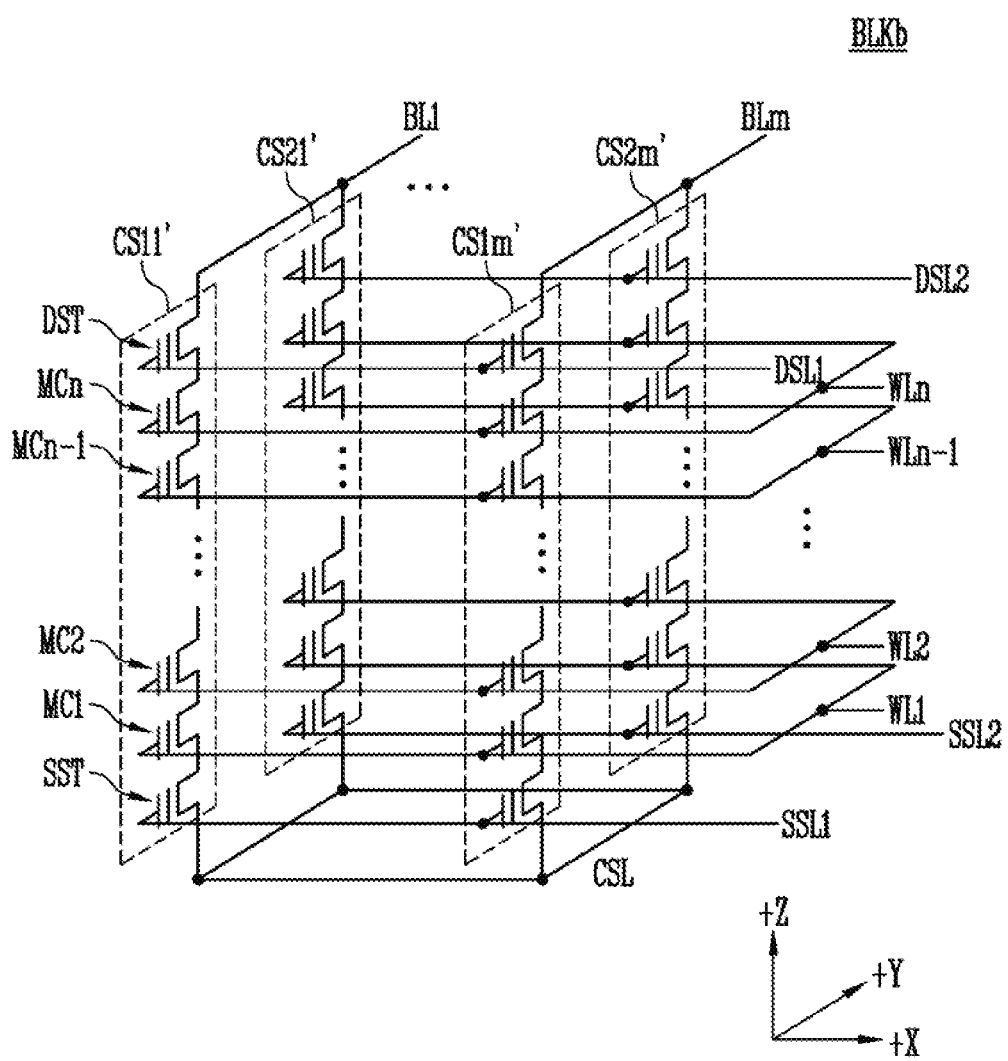
FIG. 5 is a circuit diagram illustrating another embodiment of any one memory block BLKb of the memory blocks BLK1 to BLKz of FIG. 3.

FIG. 5 is a circuit diagram illustrating another embodiment of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extend along the +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between the common source line CSL and the memory cells MC1 to MCn. The source select transistors of the cell strings arranged in the same row are connected to the same source select line. The source select transistors of the cell strings CS11' to CS1m' arranged in the first row are connected to the first source select line SSL1. The source select transistors of the cell strings CS21' to CS2m' arranged in the second row are connected to the second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. The gates of the first to n-th memory cells MC1 to MCn are connected to the first to the n-th word lines WL1 to WLn, respectively.

The drain select transistor DST of each cell string is connected between the corresponding bit line and the memory cells MC1 to MCn. The drain select transistors of the cell strings arranged in the row direction are connected to the drain select line extending in the row direction. The drain select transistors of the cell strings CS11' to CS1m' of the first row are connected to the first drain select line DSL1.

The drain select transistors of the cell strings CS21' to CS2m' of the second row are connected to the second drain select line DSL2.

As a result, the memory block BLKb of FIG. 5 has an equivalent circuit similar to the memory block BLKa of FIG. 4 except that the pipe transistor PT is excluded from each cell string.

As another embodiment, the even bit lines and the odd bit lines may be provided instead of the first to m-th bit lines BL1 to BLm. In addition, even-numbered cell strings among the cell strings CS11' to CS1m' or CS21' to CS2m' arranged in the row direction may be connected to the even bit lines, and odd-numbered cell strings among the cell strings CS11' to CS1m' or CS21' to CS2m' arranged in the row direction may be connected to the odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
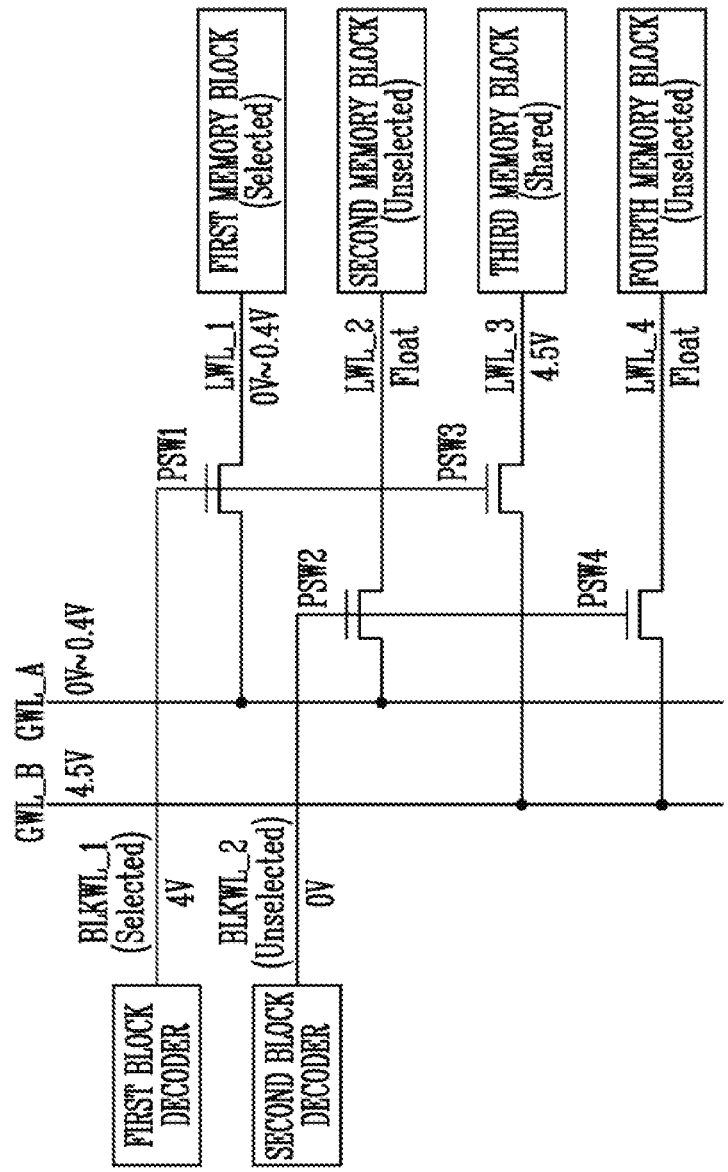
FIG. 6 is a diagram for describing a selected memory block and a shared memory block according to an embodiment of the present disclosure.

FIG. 6 is a diagram for describing a selected memory block and a shared memory block according to an embodiment of the present disclosure.

Referring to FIG. 6, the memory cell array may include first to fourth memory blocks.

The first memory block may be connected to a first block decoder through a first path switch PSW1. The second memory block may be connected to a second block decoder through a second path switch PSW2. The third memory block may be connected to the first block decoder through a third path switch PSW3. The fourth memory block may be connected to the second block decoder through a fourth path switch PSW4.

Gate electrodes of the first path switch PSW1 and the third path switch PSW3 are connected to a first block word line BLKWL_1. When the first block word line BLKWL_1 is activated, the first and third path switches PSW1 and PSW3 are turned on. The second path switch PSW2 and the fourth path switch PSW4 are connected to a second block word line BLKWL_2. When the second block word line BLKWL_2 is activated, the second and fourth path switches PSW2 and PSW4 are turned on.

First global word lines GWL_A included in a first global word line group may be connected to word lines LWL_1 included in the local line group of the first memory block through the first path switch PSW1. The first global word lines GWL_A may be connected to word lines LWL_2 included in the local line group of the second memory block through the second path switch PSW2. Second global word lines GWL_B included in a second global word line group may be connected to word lines LWL_3 included in the local line group of the third memory block through the third path switch PSW3. The second global word lines GWL_B may be connected to word lines LWL_4 included in the local line group of the fourth memory block through the fourth path switch PSW4.

The first memory block and the third memory block may share the first block word line BLKWL_1 connecting the first path switch PSW1 and the third path switch PSW3 to each other. The second memory block and the fourth memory block may share the second block word line BLKWL_2 connecting the second path switch PSW2 and the fourth path switch PSW4 to each other.

In an embodiment, an operation voltage may be applied from the first global word lines GWL_A and an operation voltage might not be applied from the second global word lines GWL_B. The first block decoder may transfer an activation voltage through the first block word line BLKWL_1. The activation voltage may be a voltage that turns on the first and third path switches PSW1 and PSW3. Therefore, the first memory block and the third memory block commonly connected to the first block decoder may be selected. The second block decoder may transfer a deactivation voltage through the second block word line BLKWL_2. The deactivation voltage may be a voltage that turns off the second and fourth path switches PSW2 and PSW4. Therefore, the second memory block and the fourth memory block commonly connected to the second block decoder may be unselected.

In an embodiment, the first memory block may be a selected memory block. The third memory block may be a shared memory block. The second and fourth memory blocks may be unselected memory blocks.

For example, the selected memory block may be the first memory block connected to the first global word lines GWL_A to which the operation voltage is applied, among the first memory block and the third memory block selected according to the activation voltage supplied through the first block word line BLKWL_1. The shared memory block may be the third memory block connected to the second global word lines GWL_B to which the operation voltage is not applied, among the first memory block and the third memory block selected according to the activation voltage supplied through the first block word line BLKWL_1. The unselected memory blocks may be the second and fourth memory blocks that are not selected according to the deactivation voltage supplied through the second block word line BLKWL_2.

In various embodiments, the global source select line and the global drain select line included in the first and second global line groups may also be connected to the source select line and drain select line of the local line group of each memory block in a method similarly to the method described above.

The number of each of the memory blocks, the block decoders, and the path switches included in the memory cell array is not limited to the present embodiment.

In the example of FIG. 6, an erase operation for the first memory block is shown. In order to erase the first memory block, an erase operation voltage may be applied to the first global word lines GWL_A. In an embodiment, the erase operation voltage may be a low voltage of 0 V to 0.4 V. On the other hand, an erase pass voltage may be applied to the second global word lines GWL_B. In an embodiment, the erase pass voltage may be a voltage of 4.5 V.

During the erase operation, the activation voltage supplied through the first block word line BLKWL_1 may have a voltage that turns on the first and third path switches PSW1 and PSW3. In an embodiment, the activation voltage supplied through the first block word line BLKWL_1 may have a voltage level of 4 V. Therefore, the first and third path switches PSW1 and PSW3 are turned on. Thus, the local word lines LWL_1 of the first memory block, which is the selected memory block, are connected to the first global word lines GWL_A. Accordingly, the erase operation voltage of 0 V to 0.4 V may be supplied to the local word lines LWL_1 of the first memory block. On the other hand, the local word lines LWL_3 of the third memory block, which is the shared memory block, are connected to the second global word lines GWL_B. Therefore, the erase pass voltage of 4.5 V is transferred to the local word lines LWL_3 of the third memory block.

On the other hand, during the erase operation, the deactivation voltage supplied through the second block word line BLKWL_2 may have a voltage that turns off the second and fourth path switches PSW2 and PSW4. In an embodiment, the deactivation voltage supplied through the second block word line BLKWL_2 may have a voltage level of 0 V. Therefore, the second and fourth path switches PSW2 and PSW4 are turned off. Thus, the local word lines LWL_2 and LWL_4 of the second memory block and the fourth memory block which are unselected memory blocks are floated.

In such an erase operation, an erase speed of the first memory block, which is the selected memory block, may be changed according to a state of the third memory block which is the shared memory block. For example, when the third memory block is in an erased state, the erase speed of the first memory block may be relatively fast. On the other hand, when the third memory block is in the programmed state, the erase speed of the first memory block may be relatively slow. The reason why the erase speed of the selected memory block is different according to the state of the shared memory block is as follows.

When the third memory block, which is the shared memory block, is in the erased state, the threshold voltages of the memory cells included in the third memory block may be low voltages included in an erased state distribution. Therefore, most of the memory cells included in the third memory block may be turned on by the erase pass voltage (for example, 4.5 V) supplied from the second global word lines GWL_B. In this case, a channel voltage of the cell string configured by the memory cells of the third memory block increases, and thus a gate-induced drain leakage (GIDL) current may be generated to a side of the bit line. The GIDL current generated in the bit line of the third memory block may be transferred to the first memory block which is the selected memory block through the drain select lines. Therefore, the erase speed of the first memory block may be relatively fast.

On the other hand, when the third memory block, which is the shared memory block, is in the programmed state, a considerable number of threshold voltages of the memory cells included in the third memory block may be low voltages included in a programmed state distribution. Therefore, some of the memory cells included in the third memory block may be turned on and some of the memory cells included in the third memory block may be turned off by the erase pass voltage (for example, 4.5 V) supplied from the second global word lines GWL_B. In this case, a relatively small amount of GIDL current may be generated in the bit line of the third memory block. Since the relatively small amount of GIDL current may be transferred to the first memory block, which is the selected memory block, through the drain select lines, the erase speed of the first memory block may be relatively slow.

As described above, the erase speed of the selected memory block may be changed according to the state of the shared memory block. Such a deviation of the erase speed may be an element that hinders the operation stability of the memory device and a storage device including the memory device.

Although the erase operation for the selected memory block has been described above, a similar problem may occur in the program operation for the selected memory block. That is, according to whether the shared memory block is in an erased state or a programmed state, a deviation of a program speed for the selected memory block may occur.

According to a method of operating a controller according to an embodiment of the present disclosure, the activation voltage level transferred to the path switch connected to the selected memory block and the shared memory block is controlled through the block word line according to the state of the shared memory block. Therefore, the erase speed deviation or the program speed deviation of the selected memory block according to the state of the shared memory block may be reduced. As a result, the operation stability of the memory device and the storage device including the memory device is improved.

Figure 7:
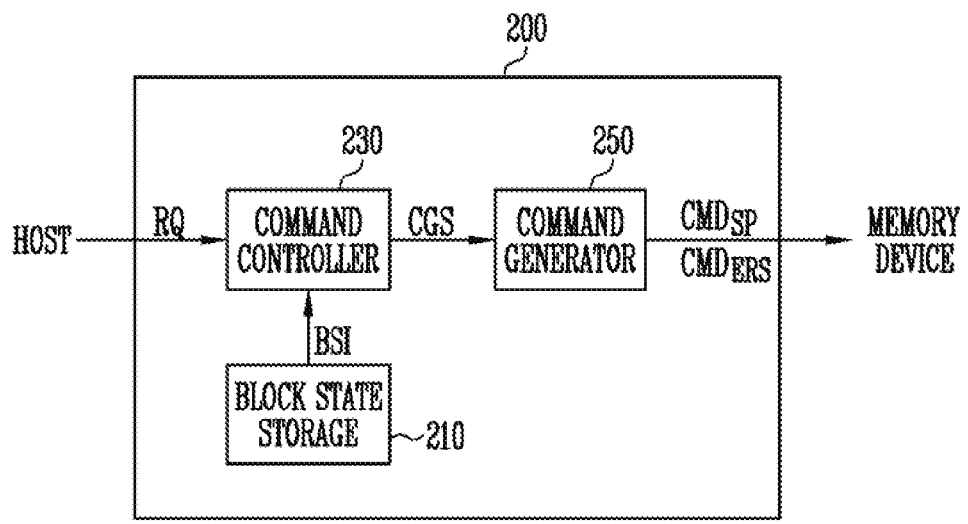
FIG. 7 is a block diagram illustrating a memory controller according to an embodiment of the present disclosure.

FIG. 7 is a block diagram illustrating a memory controller according to an embodiment of the present disclosure.

Referring to FIG. 7, the memory controller 200 according to an embodiment of the present disclosure may include a block state storage 210, a command controller 230, and a command generator 250.

The block state storage 210 may store states of the memory blocks BLK1 to BLKz included in the memory device 100. For example, the block state storage 210 may store data indicating whether each of the memory blocks BLK1 to BLKz is in the erased state or the programmed state. In an embodiment, the block state storage 210 may store a state information table including the states of each of the memory blocks BLK1 to BLKz. An example of a configuration of the state information table will be described later with reference to FIGS. 11A and 11B.

The command controller 230 may receive an operation request RQ from the host. The command controller 230 may generate a command generation signal CGS based on the operation request RQ. For example, when the operation request RQ is a read request, the command controller 230 may generate a command generation signal CGS that controls the command generator 250 to generate a read command. On the other hand, when the operation request RQ is a write request, the command controller 230 may generate a command generation signal CGS that controls the command generator 250 to generate a program command.

In FIG. 7, the command controller 230 generates the command generation signal CGS based on the operation request RQ received from the host. However, the command controller 230 according to an embodiment of the present disclosure may generate the command generation signal CGS without the operation request RQ. For example, when a specific memory block among the memory blocks of the memory device is required to be erased, the command controller 230 generates a command generation signal CGS for erasing the corresponding memory block without the request RQ from the host. In addition, when the garbage collection operation is required to be performed internally in the storage device 50, the command controller 230 may generate a command generation signal CGS for generating a read command and a program command without the request RQ from the host.

For example, the command controller 230 receives block state information BSI of the shared memory block connected to the same block decoder as a corresponding selected memory block before a target operation for the selected memory block of the memory device is performed. In an embodiment, the target operation may be the erase operation for the selected memory block. The command controller 230 controls the command generator 250 to generate a command for adjusting the activation voltage of the block word line connected to the selected memory block and the shared memory block, based on the block state information BSI. At this time, the command controller 230 may control the command generator 250 through the command generation signal CGS.

For example, the activation voltage of the block word line may be adjusted by a set-parameter command $CMD_{SP}$.

The set-parameter command $CMD_{SP}$ may be a command for controlling various setting values internally used in the memory device 100. The memory controller 200 may set an activation voltage value of the block word line, which is internally generated in the memory device 100, through the set-parameter command $CMD_{SP}$.

Thereafter, the command controller 230 may control the command generator 250 to generate a command to perform the target operation on the selected memory block. When the target operation is the erase operation for the selected memory block, the command controller 230 may generate the command generation signal CGS to control the command generator 250 to generate an erase command $CMD_{ERS}$. The generated erase command $CMD_{ERS}$ is transferred to the memory device 100. The memory device 100 may perform the erase operation for the selected memory block based on the received erase command $CMD_{ERS}$. In this case, the erase operation for the selected memory block may be performed using the activation voltage value of the block word line, which is changed based on a previously received set-parameter command $CMD_{SP}$.

When the shared memory block is in the erased state, a relatively low first voltage value is set as an activation voltage level of the block word line. As an example, the first voltage value may be about 3.5 V. When the shared memory block is in the programmed state, a relatively high second voltage value is set as the activation voltage level of the block word line. As an example, the second voltage value may be about 4 V.

When the activation voltage level of the block word line is the relatively low first voltage value, a channel voltage of the cell string is not increased easily even when the shared memory block is in the erased state. Therefore, the GIDL current transferred to the selected memory block is reduced. Thus, the erase speed deviation of the selected memory block according to the state of the shared memory block may be reduced.

Although the erase operation for the selected memory block has been described above, the present disclosure may be equally applied to the program operation for the selected memory block. That is, in the program operation for the selected memory block, the memory controller 200 according to an embodiment of the present disclosure adjusts the voltage level of the activation level of the block word line according to the state of the shared memory block. Therefore, the program speed deviation of the selected memory block according to the state of the shared memory block may be reduced. As a result, the operation stability of the memory device and the storage device including the memory device is improved.

Figure 8:
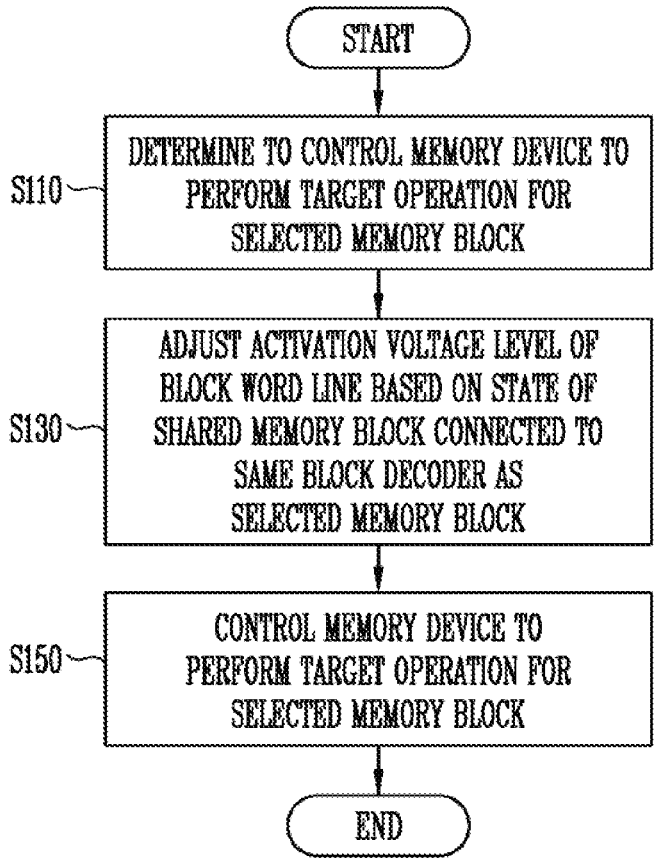
FIG. 8 is a flowchart illustrating a method of operating a memory controller according to an embodiment of the present disclosure.

FIG. 8 is a flowchart illustrating a method of operating a memory controller according to an embodiment of the present disclosure. Referring to FIG. 8, a method of operating a memory controller according to an embodiment of the present disclosure includes determining to control the memory device to perform the target operation for the selected memory block (S110), adjusting the activation voltage level of the block word line based on the state of the shared memory block (S130), and controlling the memory device to perform the target operation for the selected memory block (S150).

In step S110, the command controller 230 determines to control the memory device 100 to perform the target operation for the selected memory block. In an embodiment, the target operation may be the erase operation. In another embodiment, the target action may be the program action. As an example, the command controller 230 may determine to control the memory device to perform the target operation based on the request RQ received from the host. In another example, the command controller 230 may internally determine to control the memory device to perform the target operation regardless of the request of the host.

In step S130, the command controller 230 may receive the block state information BSI of the shared memory block that shares the block decoder with the selected memory block that is the target of the target operation from the block state storage 210. The block state information BSI may be information indicating whether the shared memory block is in the programmed state or the erased state. The command controller 230 may adjust the activation voltage level of the block word line connected to the gates of the path switches connected to the selected memory block and the shared memory block, respectively, based on the block state information BSI. In an embodiment, when the shared memory block is in the erased state, the command controller 230 may determine the relatively low first voltage value as the activation voltage level of the block word line. When the shared memory block is in the programmed state, the command controller 230 may determine the relatively high second voltage value as the activation voltage level of the block word line. The command controller 230 may control the command generator 250 to generate the set-parameter command $CMD_{SP}$ that causes the determined voltage value to be set to the activation voltage level of the block word line. For example, the command controller 230 may transfer the command generation signal CGS to the command generator 250 to control the command generator 250 to generate the set-parameter command $CMD_{SP}$. As the set-parameter command $CMD_{SP}$ is received, the memory device 100 may adjust the activation voltage level of the block word line.

In step S150, the controller 200 may control the memory device 100 to perform the target operation for the selected memory block. When the target operation is the erase operation, the command controller 230 may control the command generator 250 to generate the erase command $CMD_{ERS}$. When the target operation is the program operation, the command controller 230 may control the command generator 250 to generate the program command. For example, the command controller 230 may transfer the command generation signal CGS to the command generator 250 to generate a command for causing the memory device 100 to perform the target operation. As the generated command is received, the memory device 100 may perform the target operation.

Figure 9:
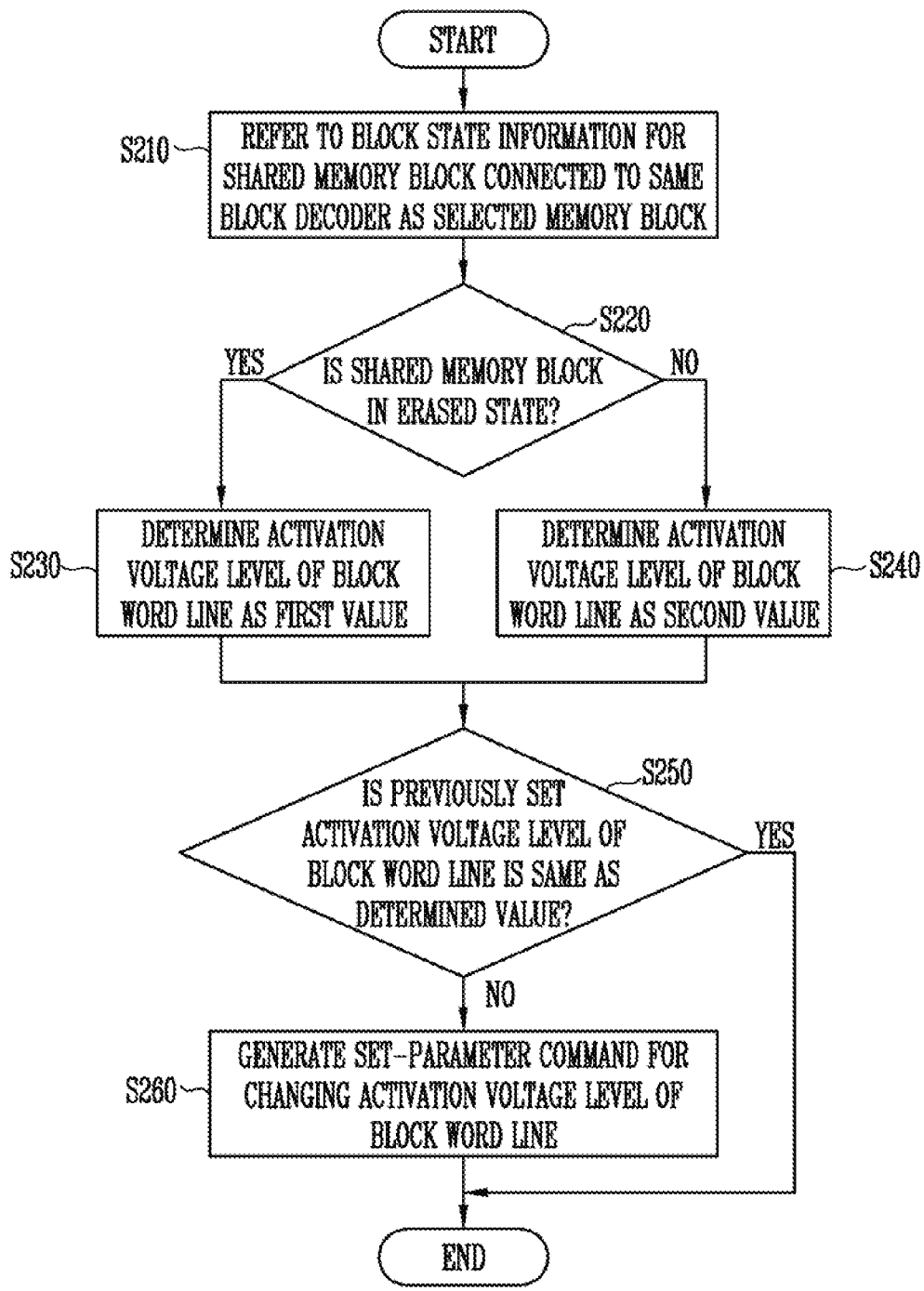
FIG. 9 is a flowchart illustrating step S130 of FIG. 8.

FIG. 9 is a flowchart illustrating step S130 of FIG. 8.

Referring to FIG. 9, step S130 includes referring to the block state information on the shared memory block connected to the same block decoder as the selected memory block (S210). In step S210, the command controller 230 may receive the block state information BSI on the shared memory block from the block state storage 210.

In step S220, the command controller 230 determines whether or not the shared memory block is in the erased state based on the received block state information BSI. When the shared memory block is in the erased state (S220; YES), the activation voltage level of the block word line is determined as the first value (S230). When the shared memory block is in the programmed state (S220: NO), the activation voltage level of the block word line is determined as the second value (S240). The first value may be a relatively smaller value than the second value.

Thereafter, in step S250, it is determined whether or not the activation voltage level of the block word line that is previously set in the memory device 100 is the same as the value determined in step S230 or step S240.

When the activation voltage level of the block word line that is previously set in the memory device 100 is the same as the value determined in step S230 or step S240 (S250; YES), the step S130 is ended. For example, in a case in which it is determined in step S220 that the shared memory block is in the erased state and the activation voltage level of the block word line is determined as the first value in step S230, when the activation voltage level that is set in the memory device 100 in advance is the same as the first value, an additional change of the activation voltage level is not required. Therefore, step S130 is ended and the process proceeds to step S150.

When the activation voltage level of the block word line that is previously set in the memory device 100 is not the same as the value determined in step S230 or step S240 (S250; NO), the set-parameter command for changing the activation voltage level of the block word line is generated (S260). For example, in a case in which it is determined in step S220 that the shared memory block is in the erased state and the activation voltage level of the block word line is determined as the first value in step S230, when the activation voltage level is the second value different from the first value, the activation voltage level of the block word line set in the memory device 100 through step S260 may be changed from the second value to the first value.

Figure 10A:
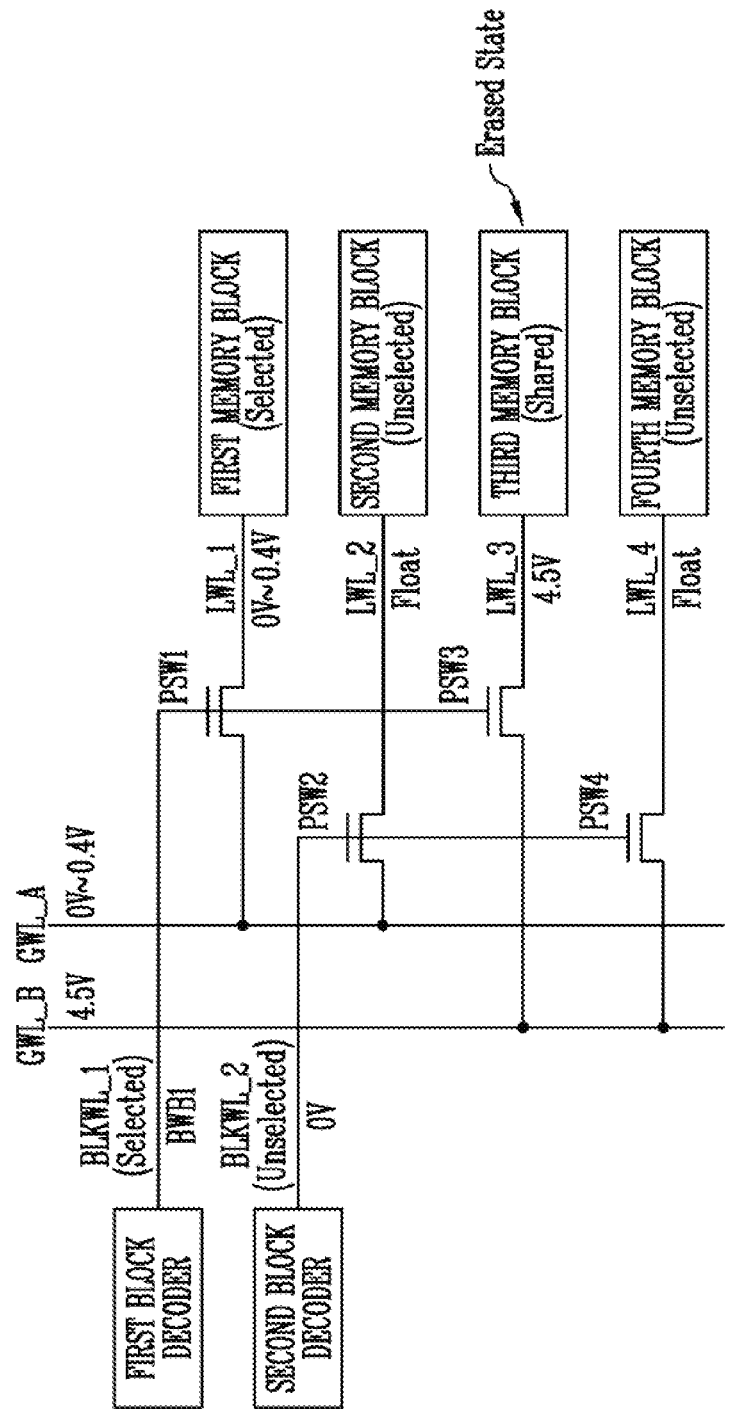

FIGS. 10A and 10B are diagrams for describing the erase operation according to the state of the shared memory block. Hereinafter, a description repetitive to that described with reference to FIG. 6 will be omitted.

Referring to FIG. 10A, the selected memory block is a first memory block, and the shared memory block is a third memory block. Meanwhile, in FIG. 10A, the third memory block, which is the shared memory block, is in the erased state. In this case, during the erase operation of the first memory block, a relatively small first value BWB1 is determined as the activation voltage level of the first block word line BLKWL_1. In one example, the first value BWB1 may be 3.5 V.

On the other hand, referring to FIG. 10B, the third memory block, which is the shared memory block, is in the programmed state. In this case, during the erase operation of the first memory block, a relatively large second value BWB2 is determined as the activation voltage level of the first block word line BLKWL_1. In one example, the first value BWB1 may be 4 V.

In a case of 10A, the relatively small first value BWB1 is applied to a gate of the third path switch PSW3, and in a case of FIG. 10B, the relatively large second value BWB2 is applied to the gate of the third path switch PSW3. Therefore, in a case of FIG. 10A, the third path switch PSW3 is turned on relatively weakly, in a case of FIG. 10B, the third path switch PSW3 is turned on relatively strongly. Thus, during the erase operation, the third memory block of FIG. 10A is in the erased state, but since the third path switch PSW3 is turned on weakly, a channel voltage of the cell string in the third memory block is prevented from being increased sharply. As a result, an amount of GIDL current generated to the side of the bit line of the cell string in the third memory block may be reduced, and increasing of the erase speed of the first memory block may be offset. Accordingly, the erase speed deviation or the program speed deviation of the selected memory block according to the state of the shared memory block may be reduced. As a result, the operation stability of the memory device and the storage device including the memory device is improved.

FIGS. 11A and 11B are diagrams for describing the state information table stored in the block state storage 210. The state information table includes a block number and state information indicating a state of a corresponding block.

Referring to FIG. 11A, state information corresponding to the first to z-th memory blocks BLK1 to BLKz is shown. A state of the first memory block BLK1 is the programmed state P, a state of the second memory block BLK2 is the erased state E, a state of the third memory block BLK3 is the erased state, and a state of the fourth memory block BLK4 is the programmed state P. The first to fourth memory blocks BLK1 to BLK4 of FIG. 11A may correspond to the first to fourth memory blocks shown in FIG. 10A, respectively. As shown in FIG. 10A, the first memory block is the selected memory block and the third memory block is the shared memory block. On the other hand, the second and fourth memory blocks are unselected memory blocks. Referring to FIG. 10A together, the first memory block BLK1 is in the programmed state P and the third memory block BLK3 is in the erased state E. When the first memory block BLK1 is erased, since the third memory block BLK3, which is the shared memory block, is in the erased state E, the activation voltage level applied to the first block word line BLKWL_1 is set as the first value BWB1. The first value BWB1 is a relatively small value, and may have a value of 3.5 V as an example.

The first to fourth memory blocks BLK1 to BLK4 of FIG. 11B may correspond to the first to fourth memory blocks shown in FIG. 10B, respectively. As shown in FIG. 10B, the first memory block is the selected memory block and the third memory block is the shared memory block. On the other hand, the second and fourth memory blocks are unselected memory blocks. Referring to FIG. 10B together, the first memory block BLK1 is in the programmed state P and the third memory block BLK3 is also in the programmed state P. When the first memory block BLK1 is erased, since the third memory block BLK3, which is the shared memory block, is in the programmed state P, the activation voltage level applied to the first block word line BLKWL_1 is set as the second value BWB2. The second value BWB2 is a relatively small value, and may have a value of 4V as an example.

As described above, according to the memory controller and the method of operating the memory controller according to an embodiment of the present disclosure, the activation voltage level transferred to the path switch connected to the selected memory block and the shared memory block through the block word line is adjusted, according to the state of the shared memory block. Therefore, the erase speed deviation or the program speed deviation of the selected memory block according to the state of the shared memory block may be reduced. As a result, the operation stability of the memory device and the storage device including the memory device is improved.

Figure 12:
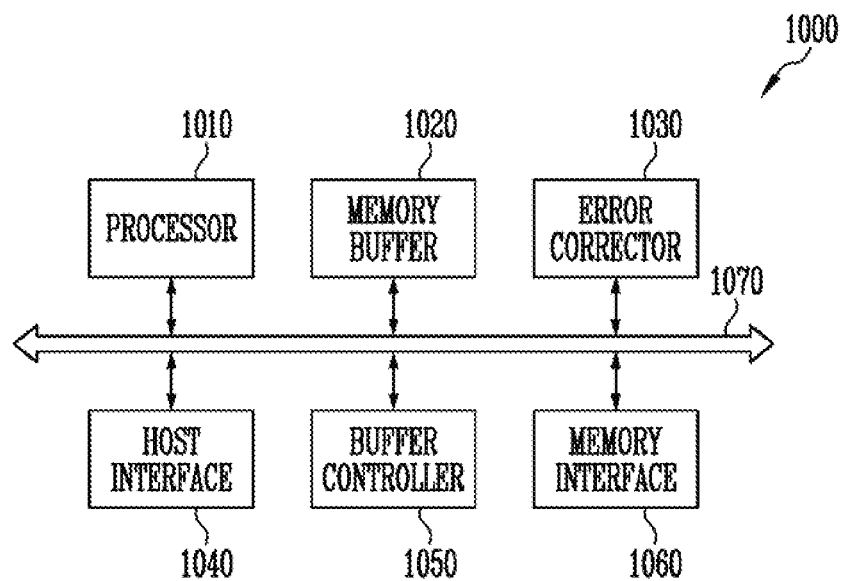
FIG. 12 is a diagram for describing another embodiment of the memory controller of FIG. 1.

FIG. 12 is a diagram for describing another embodiment of the memory controller of FIG. 1.

Referring to FIG. 12, the memory controller 1000 is connected to the host Host and the memory device. The memory controller 1000 is configured to access the memory device in response to the request from the host Host. For example, the memory controller 1000 is configured to control write, read, erase, and background operations of the memory device. The memory controller 1000 is configured to provide an interface between the memory device and the host Host. The memory controller 1000 is configured to drive firmware for controlling the memory device.

The memory controller 1000 may include a processor 1010, a memory buffer 1020, an error corrector (ECC) 1030, a host interface 1040, a buffer control circuit 1050, a memory interface 1060, and a bus 1070.

The bus 1070 may be configured to provide a channel between components of the memory controller 1000.

The processor 1010 may control all operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) using a mapping table and may convert the logical block address (LBA) into the physical block address (PBA). There are various mapping methods of an address of the flash translation layer, according to the mapping unit. Representative address mapping methods include a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host Host.

As an example, the processor 1010 may perform the randomization and de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. Error corrector 1030 may perform error correction encoding (ECC encoding) based on data to be written to the memory device through memory interface 1060. The error correction encoded data may be transferred to the memory device through the memory interface 1060. The error corrector 1030 may perform error correction decoding (ECC decoding) on the data received from the memory device through the memory interface 1060. As an example, the error corrector may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

As an example, the memory controller 1000 might not include the memory buffer 1020 and the buffer controller 1050.

As an example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

As an example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1202, and the memory interface 1060.

Figure 13:
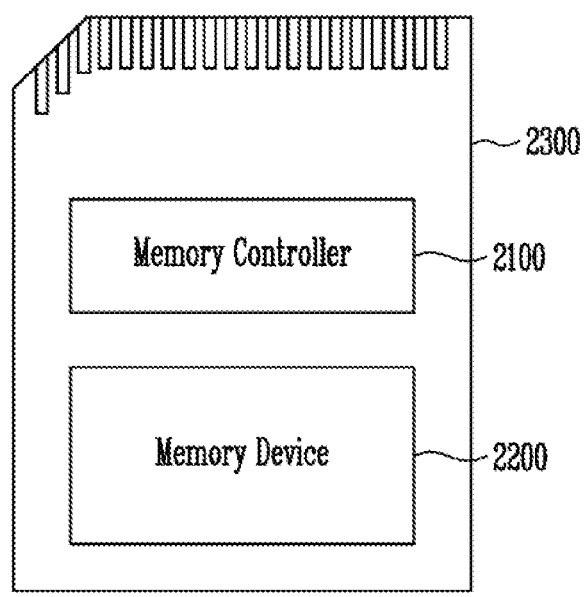
FIG. 13 is a block diagram illustrating a memory card system to which a storage device according to an embodiment of the present disclosure is applied.

FIG. 13 is a block diagram illustrating a memory card system to which a storage device according to an embodiment of the present disclosure is applied.

Referring to FIG. 13, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and the host Host. The memory controller 2100 is configured to drive firmware for controlling the memory device 2200. The memory controller 2100 may be implemented equally to the memory controller 200 described with reference to FIG. 1.

As an example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be configured as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into a one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 14:
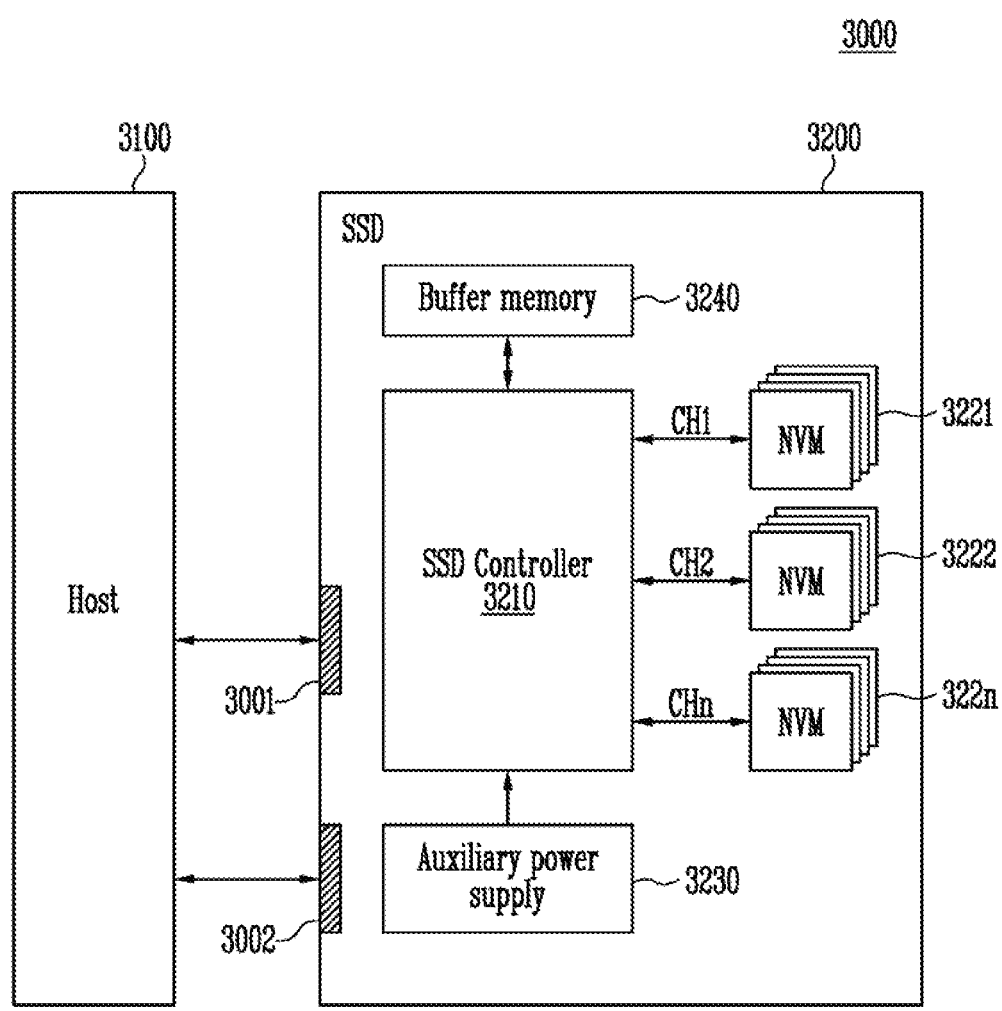
FIG. 14 is a block diagram illustrating a solid state drive (SSD) system to which a storage device according to an embodiment of the present disclosure is applied.

FIG. 14 is a block diagram illustrating a solid state drive (SSD) system to which a storage device according to an embodiment of the present disclosure is applied.

Referring to FIG. 14, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322*n*, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322*n* in response to the signal SIG received from the host 3100. As an example, the signal SIG may be signals based on the host 3100 and an interface of the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 receives the power PWR from the host 3100 and may charge the power. The auxiliary power device 3230 may provide power of the SSD 3200 when the power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322*n*, or may temporarily store metadata (for example, a mapping table) of the flash memories 3221 to 322*n*. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 15:
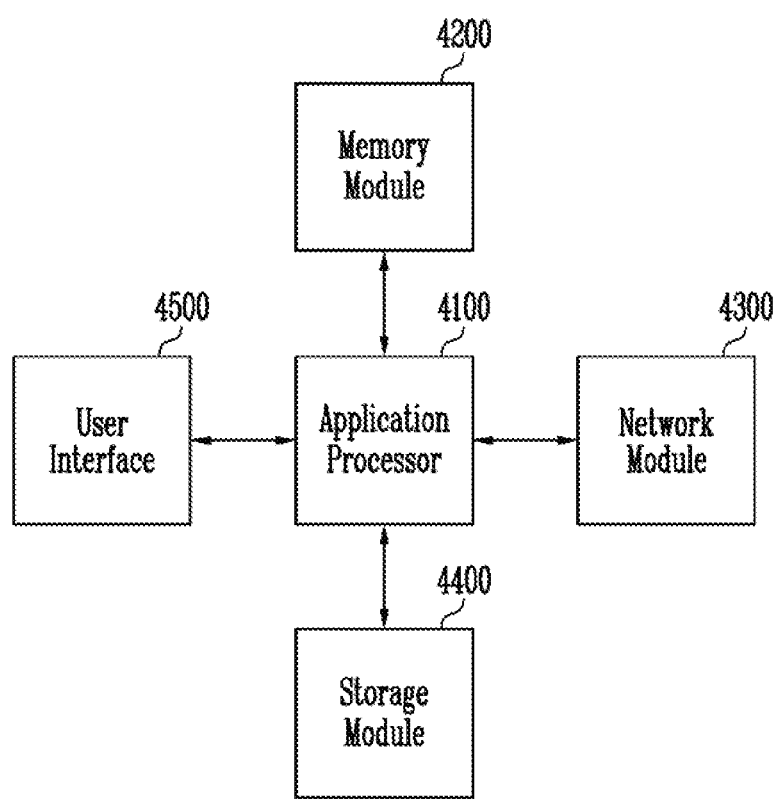
FIG. 15 is a block diagram illustrating a user system to which a storage device according to an embodiment of the present disclosure is applied.

FIG. 15 is a block diagram illustrating a user system to which a storage device according to an embodiment of the present disclosure is applied.

Referring to FIG. 15, the user system 4000 includes an application processor 4100, a memory module 4200, a network module 4300, a storage module 4400, and a user interface 4500.

The application processor 4100 may drive components, an operating system (OS), a user program, or the like included in the user system 4000. As an example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, a LPDDR SDARM, a LPDDR2 SDRAM, and a LPDDR3 SDRAM, or a non-volatile random access memory, such as a PRAM, a ReRAM, an MRAM, and an FRAM. As an example, the application processor 4100 and memory module 4200 may be packaged based on a package on package (POP) and provided as a one semiconductor package.

The network module 4300 may communicate with external devices. As an example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. As an example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. As an example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. As an example, the storage module 4400 may be provided as a removable storage device (removable drive), such as a memory card, and an external drive of the user system 4000.

As an example, the storage module 4400 may include a plurality of non-volatile memory devices, and the plurality of non-volatile memory devices may operate equally to the memory device 100 described with reference to FIG. 1. The storage module 4400 may operate equally to the storage device 50 described with reference to FIG. 1.

The user interface 4500 may include interfaces for inputting data or an instruction to the application processor 4100 or for outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display, an active matrix OLED (AMOLED) display, an LED, a speaker, and a motor.

Although the detailed description of the present disclosure describes various embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the limited embodiments and drawings, the present disclosure is not limited to the embodiments described above, and various changes and modifications may be made from the disclosed description by those skilled in the art to which the present disclosure pertains.

Therefore, the scope of the present disclosure should not be limited to the described embodiments, and should be determined by the equivalents of the claims as well as the following claims.

In the embodiments described above, all of the steps may optionally be performed or omitted. In addition, the steps in each embodiment need not occur in order, and may be reversed. Meanwhile, the embodiments of the present disclosure disclosed in the present specification and the drawings are merely specific examples for easily describing the technical content of the present specification and facilitating understanding of the present specification and do not limit the scope of the present specification. That is, it is apparent to those skilled in the art to which the present disclosure pertains that other modification examples based on the technical spirit of the present disclosure are possible.

Meanwhile, the present specification and drawings disclose a preferred embodiment of the present disclosure. Although specific terms are used, they are used in general meaning for purposes of easily describing technical content of the present disclosure and facilitating understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

What is claimed is:

1. A memory controller that controls a memory device comprising:
    a first memory block connected to a first global word line through a first path switch;
    a second memory block connected to a second global word line through a second path switch; and
    a block decoder connected to a gate of the first and second path switches through a block word line, the memory controller comprising:
    a block state storage configured to store block state information of the first and second memory blocks; and
    a command controller configured to determine to perform a target operation on the first memory block and determine an activation voltage level transferred to the block word line based on the block state information of the second memory block,
    wherein the command controller determines a first value as the activation voltage level when the second memory block is in an erased state and determines a second value different from the first value as the activation voltage level when the second memory block is in a programmed state.

2. The memory controller of claim 1, wherein the target operation is an erase operation.

3. The memory controller of claim 1, wherein the target operation is a program operation.

4. The memory controller of claim 1, wherein the first value and the second value are voltages for turning on the first path switch and the second path switch.

5. The memory controller of claim 4, wherein the first value is less than the second value.

6. The memory controller of claim 5, wherein the second path switch is turned on relatively weaker, when the first value is applied as the activation voltage level when the second memory block is in the erased state, than when the second path switch is turned on when the second value is applied as the activation voltage level when the second memory block is in the programmed state.

7. The memory controller of claim 1, further comprising:
    a command generator configured to generate a set-parameter command based on the determined activation voltage level.

8. The memory controller of claim 7, wherein the command generator further generates a command for controlling the memory device to perform the target operation after the generation of the set-parameter command.

9. A storage device comprising:
    a memory device including a block decoder, a selected memory block, and a shared memory block; and
    a memory controller configured to control an operation of the memory device,
    wherein the selected memory block is connected to a first global word line through a first path switch, the shared memory block is connected to a second global word line through a second path switch, the block decoder is connected to gates of the first and second path switches through a block word line, and
    the memory controller controls the memory device to set an activation voltage level transferred to the block word line based on a state of the shared memory block.

10. The storage device of claim 9, wherein the memory controller controls the memory device to perform a target operation for the selected memory block, after the memory device sets the activation voltage level.

11. The storage device of claim 9, wherein the memory controller controls the memory device to set a first value as the activation voltage level when the shared memory block is in an erased state and to set a second value as the activation voltage level when the shared memory block is in a programmed state, and wherein the second value is greater than the first value.

12. The storage device of claim 11, wherein the first value and the second value are voltages for turning on the first path switch and the second path switch.

13. A method of operating a memory controller that controls a memory device comprising:
- a first memory block connected to a first global word line through a first path switch;
- a second memory block connected to a second global word line through a second path switch; and
- a block decoder connected to a gate of the first and second path switches through a block word line, the method comprising:
- determining to control the memory device to perform a target operation for the first memory block;
- adjusting an activation voltage level of the block word line based on a state of the second memory block; and
- controlling the memory device to perform the target operation for the first memory block,
- wherein the adjusting the activation voltage level of the block word line based on the state of the second memory block comprises:
  - determining the activation voltage level of the block word line based on block state information for the second memory block; and
  - controlling the memory device to set the determined activation voltage level.

14. The method of claim 13, wherein the determining the activation voltage level of the block word line based on the block state information comprises:
- determining the activation voltage level of the block word line as a first value when the second memory block is in an erased state; and
- determining the activation voltage level of the block word line as a second value different from the first value when the second memory block is in a programmed state.

15. The method of claim 14, wherein the first value is less than the second value.

16. The method of claim 13, wherein the controlling the memory device to set the determined activation voltage level comprises generating a set-parameter command for changing the activation voltage level when the activation voltage level of the block word line that is previously set in the memory device is different from the activation voltage level determined based on the block state information.

* * * * *